(12) United States Patent
Seki

(10) Patent No.: US 10,941,301 B2
(45) Date of Patent: Mar. 9, 2021

(54) SURFACE TREATMENT METHOD, SURFACE TREATMENT AGENT, AND METHOD FOR FORMING FILM REGION-SELECTIVELY ON SUBSTRATE

(71) Applicant: TOKYO OHKA KOGYO CO., LTD., Kawasaki (JP)

(72) Inventor: Kenji Seki, Kawasaki (JP)

(73) Assignee: Tokyo Ohka Kogyo Co., Ltd., Kawasaki (JP)

(*) Notice: Subject to any disclaimer, the term of this patent is extended or adjusted under 35 U.S.C. 154(b) by 0 days.

(21) Appl. No.: 16/229,854

(22) Filed: Dec. 21, 2018

(65) Prior Publication Data
US 2019/0203054 A1 Jul. 4, 2019

(30) Foreign Application Priority Data

Dec. 28, 2017 (JP) ............................ JP2017-254944
Jun. 29, 2018 (JP) ............................ JP2018-125174

(51) Int. Cl.
*H01L 29/78* (2006.01)
*H01L 21/8234* (2006.01)
(Continued)

(52) U.S. Cl.
CPC ............ *C09D 5/00* (2013.01); *C23C 16/0227* (2013.01); *C23C 16/0272* (2013.01); *C23C 16/04* (2013.01); *C23C 16/45525* (2013.01); *C23C 16/45534* (2013.01); *C23C 16/45553* (2013.01); *H01L 21/0228* (2013.01); *H01L 21/02312* (2013.01); *H01L 21/02639* (2013.01);
(Continued)

(58) Field of Classification Search
CPC ...... C07F 7/10; H01L 21/3105; H01L 21/306; H01L 21/0271
See application file for complete search history.

(56) References Cited

U.S. PATENT DOCUMENTS 6,391,785 B1 5/2002 Satta et al.
2010/0240219 A1* 9/2010 Tomita .............. H01L 21/02071
438/706
(Continued)

FOREIGN PATENT DOCUMENTS

JP 4043785 B 11/2007

OTHER PUBLICATIONS

Hashemi et al. "A New Resist for Area Selective Atomic and Molecular Layer Deposition on Metal—Dielectric Patterns", *J. Phys. Chem. C* 2014, 118, pp. 10957-10962.

*Primary Examiner* — Brian Turner
(74) *Attorney, Agent, or Firm* — Knobbe Martens Olson & Bear LLP

(57) ABSTRACT

A surface treatment method for a substrate surface; a surface treatment agent used for the surface treatment method; and a method for forming a film on a substrate in a region-selective manner. The method includes exposing the surface to a surface treatment agent including a silylation agent and a nitrogen-containing heterocyclic compound, the surface including two or more regions, adjacent regions in the two or more regions having different materials, and a reaction between the silylation agent and the two or more regions causing contact angles of water to differ from each other with respect to adjacent regions in the two or more regions.

8 Claims, 1 Drawing Sheet

(51) Int. Cl.
*H01L 27/088* (2006.01)
*H01L 29/66* (2006.01)
*H01L 21/02* (2006.01)
*H01L 21/762* (2006.01)
*C09D 5/00* (2006.01)
*C23C 16/455* (2006.01)
*C23C 16/02* (2006.01)
*H01L 21/3205* (2006.01)
*H01L 21/321* (2006.01)
*C23C 16/04* (2006.01)
*H01L 21/3105* (2006.01)
*H01L 21/32* (2006.01)

(52) U.S. Cl.
CPC ........ *H01L 21/3105* (2013.01); *H01L 21/321* (2013.01); *H01L 21/3205* (2013.01); *H01L 21/02521* (2013.01); *H01L 21/32* (2013.01)

(56) References Cited

U.S. PATENT DOCUMENTS

| | | | |
|---|---|---|---|
| 2011/0054184 A1* | 3/2011 | Yoshida | C07F 7/10 548/110 |
| 2014/0206832 A1* | 7/2014 | Martens | C08G 77/02 528/10 |
| 2016/0163725 A1* | 6/2016 | Kamiya | H01L 21/02247 257/321 |
| 2018/0277357 A1* | 9/2018 | Wojtczak | H01L 21/02052 |
| 2019/0067450 A1* | 2/2019 | Ching | H01L 21/31051 |
| 2019/0148238 A1* | 5/2019 | Lu | H01L 29/66795 257/213 |

* cited by examiner

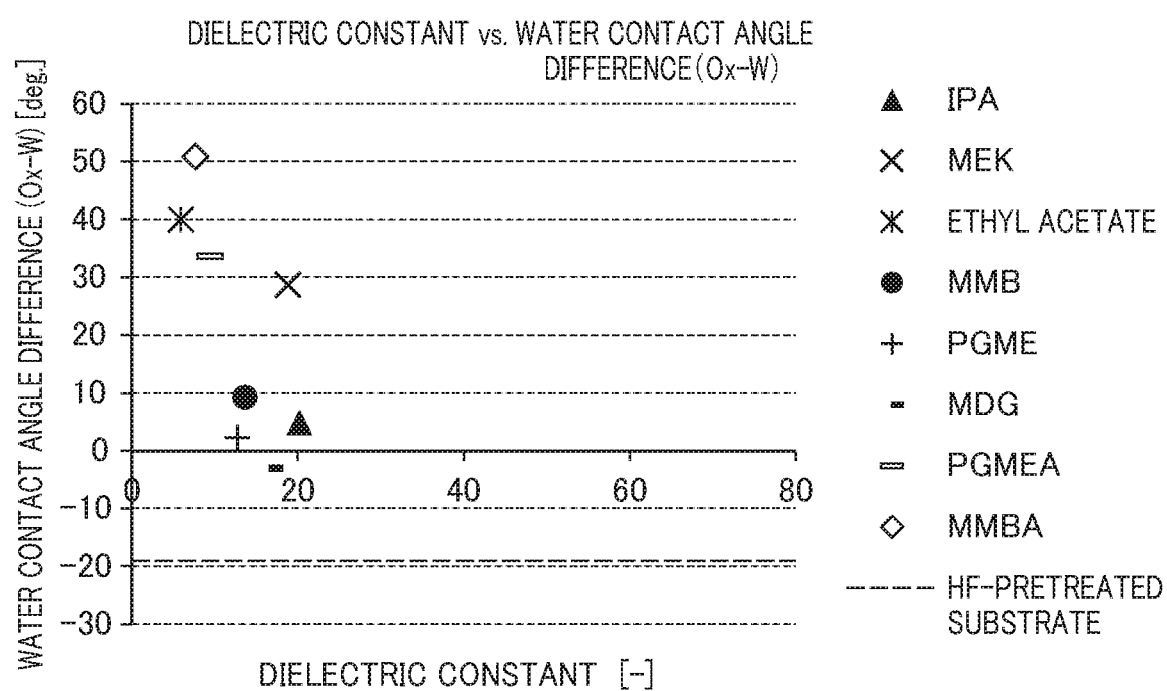

US 10,941,301 B2

SURFACE TREATMENT METHOD, SURFACE TREATMENT AGENT, AND METHOD FOR FORMING FILM REGION-SELECTIVELY ON SUBSTRATE

This application claims priority to Japanese Patent Application No. 2017-254944, filed Dec. 28, 2017; and Japanese Patent Application No. 2018-125174, filed Jun. 29, 2018, the entire contents of which are incorporated herein by reference.

BACKGROUND OF THE INVENTION

Field of the Invention

The present invention relates to a surface treatment method capable of modifying a substrate surface region-selectively, which is used in, for example, manufacturing a semiconductor integrated circuit and the like, a surface treatment agent used for the surface treatment method, and a method for forming a film region-selectively on a substrate by using an atomic layer deposition method.

Related Art

In recent years, trends toward higher integration and miniaturization of semiconductor devices have grown, and thus refinement of an organic pattern as a mask and an inorganic pattern prepared by an etching process have advanced, and film thickness control in an atomic layer level has been demanded. As a method for forming a thin film on a substrate in the atomic layer level, an atomic layer deposition (ALD) method (hereinafter, also simply referred to as an "ALD method") has been known. The ALD method is known to have higher step difference covering properties (step coverage) and film-thickness controllability as compared with a general chemical vapor deposition (CVD) method.

The ALD method is a thin-film forming technique in which supplying of two types of gases mainly composed of elements constituting a film to be formed onto a substrate alternately, and forming a thin film in an atomic layer unit on the substrate are repeated a plurality of times, thereby forming a film having a desired thickness. The ALD method uses a deposition self-controlling function (self-limiting function) in which during the supplying of a raw material gas, only one or a few layers of components of the raw material gas are adsorbed onto a substrate surface, and extra raw material gas does not contribute to the deposition. For example, when an $Al_2O_3$ film is formed on a substrate, a raw material gas made of TMA (TriMethyl Aluminum) and an oxidizing gas including O are used. Furthermore, when a nitride film is formed on a substrate, nitriding gas is used instead of the oxidizing gas.

Patent Document 1: Japanese Patent No. 4043785
Non-Patent Document 1: J. Phys. Chem. C 2014, 118, 10957-10962

SUMMARY OF THE INVENTION

In recent years, a method for forming a film region-selectively on a substrate surface has been attempted using the ALD method (see Patent Document 1 and Non-Patent Document 1). Accordingly, a substrate, in which a substrate surface has been modified region-selectively so that the substrate surface can be suitably applied to the method for forming a film region-selectively on the substrate by the ALD method, has been demanded. When the ALD method is used in the film formation method, film-thickness control in an atomic layer level, step coverage and refinement of patterning are expected.

The present invention has been made considering the above situation, and has an object to provide a surface treatment method for a substrate surface, capable of modifying (for example, imparting hydrophobicity) at modification degrees that are different depending on materials of regions of a substrate surface having a plurality of regions; a surface treatment agent used for the surface treatment method; and a method for forming a film region-selectively on a substrate using the ALD method.

The present inventors have found that by carrying out a process using a silylation agent and a nitrogen-containing heterocyclic compound, a modification degree can be changed depending on materials of a substrate surface, thereby arriving at completion of the present invention. Specifically, the present invention provides the following.

A first aspect of the present invention is a surface treatment method for a surface of a substrate, the method including: exposing the surface to a surface treatment agent including a silylation agent (A) and a nitrogen-containing heterocyclic compound (B),
wherein the surface includes two or more regions,
adjacent regions in the two or more regions have different materials, and
a reaction between the silylation agent and the two or more regions causes contact angles of water to differ from each other with respect to adjacent regions in the two or more regions.

A second aspect of the present invention is a surface treatment agent to be used in the surface treatment method according to the first aspect. The surface treatment agent includes a silylation agent (A) and a nitrogen-containing heterocyclic compound (B).

A third aspect of the present invention is a method for forming a film region-selectively on a substrate, the method including: treating the surface of the substrate by the surface treatment method according to the first aspect, and
forming a film on the surface of the substrate that has been surface-treated by an atomic layer deposition method,
wherein a deposition amount of materials of the film is made to be different region-selectively.

A surface treatment method of the present invention can provide a substrate that can be modified (for example, hydrophobicity can be imparted) at different modification degrees depending on materials of regions of the substrate surface having a plurality of regions, and in particular that can be suitably applied to region-selective film formation on the substrate surface using the ALD method. A surface treatment agent of the present invention can provide the surface treatment method. A method for forming a film region-selectively on a substrate according to the present invention can carry out film thickness control in an atomic layer level, and can form a film excellent in step coverage region-selectively on the substrate.

BRIEF DESCRIPTION OF THE DRAWING

FIG. 1 is a view showing a relationship of a water contact angle difference between an Ox substrate and a W substrate with respect to dielectric constants of various solvents.

DETAILED DESCRIPTION OF THE INVENTION

Hereinafter, an embodiment of the present invention will be described in detail, but the present invention is not limited to the following embodiment, and appropriate modification can be added within the scope of the object of the present invention.

<<Surface Treatment Method for Surface of Substrate>>

The surface treatment method according to the first aspect is a surface treatment method for a surface of a substrate, the method including: exposing the surface to a surface treatment agent including a silylation agent (A) and a nitrogen-containing heterocyclic compound (B), wherein the surface includes two or more regions, adjacent regions in the two or more regions have different materials, and a reaction between the silylation agent and the two or more regions causes contact angles of water to differ from each other with respect to adjacent regions in the two or more regions.

As the "substrate" that is a subject of surface treatment, a substrate used for producing semiconductor devices is exemplified, and examples of the substrate include a silicon (Si) substrate, a silicon nitride (SiN) substrate, a silicone oxide film (Ox) substrate, a tungsten (W) substrate, a cobalt (Co) substrate, a titanium nitride (TiN) substrate, a tantalum nitride (TaN) substrate, a germanium (Ge) substrate, a silicon germanium (SiGe) substrate, an aluminum (Al) substrate, a nickel (Ni) substrate, a ruthenium (Ru) substrate, a copper (Cu) substrate, and the like. The "surface of a substrate" is exemplified by the surface of the substrate itself, the surfaces of the organic pattern and inorganic pattern provided on the substrate, as well as the surfaces of an inorganic layer and an organic layer that have not been patterned.

Examples of the inorganic pattern provided on the substrate include a pattern that has been formed by producing an etching mask on the surface of an inorganic layer present on the substrate by way of a photoresist method, and subsequently performing an etching process. Examples of the inorganic layer other than the substrate itself include an oxide film of an element constituting the substrate, and a film or layer, etc. of inorganic matter such as SiN, Ox, W, Co, TiN, TaN, Ge, SiGe, Al, Ni, Ru, Cu, and the like, formed on the surface of the substrate. Although such a film or layer is not particularly limited, a film or layer of inorganic matter, etc. that is formed in the manufacturing process of the semiconductor device is exemplified.

Examples of the organic pattern provided on the substrate include a resin pattern formed on a substrate by way of a photolithography method using photoresist and the like. Such an organic pattern can be formed, for example, by forming an organic layer, which is a film of photoresist, on the substrate, exposing this organic layer through a photomask, and developing. In addition to the surface of the substrate itself, the organic layer may be an organic layer that is provided on the surface or the like of a laminated film provided on the surface of the substrate. Although such an organic film or layer is not particularly limited, a film of organic matter provided in order to form an etching mask in manufacturing process of a semiconductor device is exemplified.

(Aspect in which Substrate Surface Includes Two Regions)

In the surface treatment method according to the first aspect, the substrate surface includes two or more regions, and adjacent regions in the two or more regions have different materials.

In the two or more regions, as a region in which a contact angle of water (preferably, hydrophobicity) tends to be larger than the other region(s), a region including at least one selected from the group consisting of Si, SiN, Ox, TiN, TaN, Ge, and SiGe is exemplified. In the two or more regions, as a region in which a contact angle of water (preferably, hydrophobicity) tends to be smaller than the other region(s), a region including at least one selected from the group consisting of W, Co, Al, Ni, Ru, Cu, TiN, and TaN is exemplified.

For example, when one region in the two or more regions is a first region and a region adjacent to the first region is a second region, the first region and the second region have different materials. Herein, the first region and the second region may or may not be divided into a plurality of regions. Examples of the first region and the second region include an aspect in which a surface of a substrate itself is a first region and a surface of an inorganic layer formed on the surface of the substrate is a second region, an aspect in which a surface of a first inorganic layer formed on a surface of the substrate is a first region and a surface of a second inorganic layer formed on a surface of the substrate is a second region. Note here that an aspect in which an organic layer is formed instead of formation of these inorganic layers can also be similarly exemplified. As the aspect in which the surface of the substrate itself is the first region, and a surface of an inorganic layer formed on the surface of the substrate is the second region, from the viewpoint of selectively improving hydrophobicity and improving the difference in the contact angles of water between the two or more adjacent regions having different materials in the substrate surface, an aspect where a surface of at least one substrate selected from the group consisting of a Si substrate, a SiN substrate, an Ox substrate, a TiN substrate, a TaN substrate, a Ge substrate, and a SiGe substrate is the first region, and a surface of an inorganic layer formed on the surface of the substrate and including at least one selected from the group consisting of W, Co, Al, Ni, Ru, Cu, TiN and TaN is the second region is preferable. Furthermore, as the aspect in which the surface of the first inorganic layer formed on the surface of the substrate is the first region, and a surface of the second inorganic layer formed on the surface of the substrate is the second region, from the viewpoint of selectively improving hydrophobicity and improving the difference in the contact angles of water between the two or more adjacent regions having different materials in the substrate surface, an aspect where the surface of the first inorganic layer including at least one selected from the group consisting of SiN, Ox, TiN, TaN, Ge, and SiGe formed on a surface of an arbitrary substrate (for example, a Si substrate) is the first region, and the surface of the second inorganic layer formed on the substrate and including at least one selected from the group consisting of W, Co, Al, Ni, Ru, Cu, TiN, and TaN is the second region is preferable.

(Aspect in which Substrate Surface Includes Three or More Regions)

When one region of the two or more regions is a first region, a region adjacent to the first region is a second region, and further a region adjacent to the second region is a third region, the first region and the second region have different materials, and the second region and the third region have different materials. Herein, when the first region and the third region are adjacent to each other, the first region and the third region have different materials. When the first region and the third region are not adjacent to each other, the first region and the third region may or may not have different materials. Furthermore, the first region, the second region, and the third region may or may not be divided into a plurality of regions, respectively. Examples of the first region, the second region, and the third region include an aspect in which a surface of the substrate itself is the first region, a surface of a first inorganic layer formed on the surface of the substrate is the second region, and a surface of a second inorganic layer formed on the surface of the substrate is the third region, and the like. Note here that an aspect in which an organic layer is formed instead of formation of these inorganic layers can also be similarly exemplified. Furthermore, an aspect including both an inorganic layer and an organic layer in which only one of the second inorganic layer and the third inorganic layer is changed to an organic layer and formed can also be similarly exemplified. From the viewpoint of selectively improving hydrophobicity and improving the difference in the contact angles of water between the two or more adjacent regions having different materials on the substrate surface, an aspect where a surface of an arbitrary substrate (for example, a Si substrate) itself is the first region, a surface of a first inorganic layer formed on the surface of the substrate, and including at least one selected from the group consisting of SiN, Ox, TiN, TaN, Ge, and SiGe is the second region, and a surface of a second inorganic layer formed on the surface of the substrate and including at least one selected from the group consisting of W, Co, Al, Ni, Ru, Cu, TiN, and TaN is the third region is preferable. The same concept can be applied to the case where a fourth or more regions exist. The upper limit of the number of the regions having different materials is not particularly limited as long as the effect of the present invention is not impaired, but the upper limit is, for example, 7 or less or 6 or less, and typically 5 or less.
(Exposure)

Examples of the method of exposing a surface of a substrate to a surface treatment agent include a method of exposing a surface of a substrate to a surface treatment agent (typically, liquid surface treatment agent) that may include a solvent by application (for example, coating) by means of coating methods such as a dip coating method, or a spin coating method, a roll coating method, and a doctor blading method, and the like. The exposure temperature is, for example, 10° C. or higher and 90° C. or lower, preferably 20° C. or higher and 80° C. or lower, more preferably 30° C. or higher and 70° C. or lower, and further preferably 40° C. or higher and 60° C. or lower. The exposure time is preferably 20 seconds or more, more preferably one minute or more, and further preferably 10 minutes or more from the viewpoint of improvement of selective hydrophobicity in two or more adjacent regions having different materials on the substrate surface. The upper limit of the exposure time is not particularly limited, but it is, for example, 6 hours or less, and typically two hours or less. After the exposure, cleaning (for example, cleaning with water, activator rinse, and the like) and/or drying (cleaning by nitrogen blowing, and the like) may be carried out if necessary. For example, in a cleaning process using a cleaning liquid for the substrate surface having an inorganic pattern or an organic pattern, cleaning liquids that have been conventionally used in cleaning processes of inorganic patterns or organic patterns can be employed without modification. SPM (sulfuric acid/hydrogen peroxide solution), APM (ammonia/hydrogen peroxide solution), and the like, can be exemplified for the inorganic pattern, and water, activator rinse, and the like, can be exemplified for the organic pattern. Furthermore, to the treated substrate after drying, heat treatment at 100° C. or higher and 300° C. or lower may be additionally carried out if necessary.

The exposure causes region-selective silylation depending on materials of regions on the substrate surface. The contact angle of water on the substrate surface after exposure to the surface treatment agent can be, for example, 5° or more and 140° or less. By controlling the material of the substrate surface, types and use amount of the silylation agent (A) and the nitrogen-containing heterocyclic compound (B), and exposure conditions, and the like, the contact angle of water can be 50° or more, preferably 60° or more, more preferably 70° or more, further preferably 90° or more, particularly preferably 100° or more, and the most preferably 101° or more. The upper limit of the contact angle is not particularly limited, and is, for example, 140° or less, and typically 130° or less.

In the surface treatment method according to the first aspect, since materials are different in two or more adjacent regions on the substrate surface, the exposure enables selective improvement of hydrophobicity between the two or more adjacent regions, and contact angles of water can be made different. The difference in the contact angles of water between two or more adjacent regions is not particularly limited as long as the effect of the present invention is not impaired, and it is, for example, 10° or more. From the viewpoint of the selective improvement of the hydrophobicity between two or more adjacent regions, the difference in the contact angles of water is preferably 20° or more, more preferably 30° or more, and further preferably 40° or more. The upper limit of the difference in the contact angle is not particularly limited as long as the effect of the present invention is not impaired, and it is, for example, 80° or less or 70° or less, and typically 60° or less.
<Surface Treatment Agent>

Subsequently, a surface treatment agent to be used for the surface treatment method according to the first aspect will be described. In this aspect, the surface treatment agent includes a silylation agent (A) and a nitrogen-containing heterocyclic compound (B). Hereinafter, each component will be described.
[Silylation Agent (A)]

Silylation agent (A) is a component for silylating a surface of a substrate so as to increase hydrophobicity of the surface of the substrate. The silylation agent (A) is not particularly limited, and any conventionally well-known silylation agent can be used. As such a silylation agent, for example, an alkoxymonosilane compound having a hydrophobic group bonded to a silicon atom, and a compound including a hydrophobic group bonded to a silicon atom and a leaving group bonded to a silicon atom (in more detail, for example, a compound represented by the below-mentioned general formula (2), and the like) can be used.
(Alkoxymonosilane Compound having Hydrophobic Group Bonded to Silicon Atom)

An alkoxymonosilane compound having a hydrophobic group bonded to a silicon atom means a compound having one silicon atom, at least one hydrophobic group bonded to the silicon atom, and at least one alkoxy group bonded to the silicon atom. When the alkoxymonosilane compound having a hydrophobic group bonded to a silicon atom is used as the silylation agent (A), an alkoxymonosilane compound having a hydrophobic group can be bonded to the surface of the substrate. When the alkoxymonosilane compound is bonded to the substrate, a monomolecular film derived from the alkoxymonosilane compound can be formed on the substrate surface. Such a monomolecular film is preferably a self-assembled monolayer (SAM) film in which a network of siloxane bonds is formed in the plane direction of the substrate. The monomolecular film and the self-assembled monolayer film will be described later in detail.

From the viewpoint of selective improvement of hydrophobicity between two or more adjacent regions having different materials on the substrate surface, the hydrophobic group of the alkoxymonosilane compound is preferably a chain aliphatic hydrocarbon group having 3 or more and 20 or less carbon atoms, more preferably a chain aliphatic hydrocarbon group having 6 or more and 18 or less carbon atoms, further preferably a chain aliphatic hydrocarbon group having 7 or more and 12 or less carbon atoms, particularly preferably a chain aliphatic hydrocarbon group having 8 or more and 11 or less carbon atoms, and the most preferably a chain aliphatic hydrocarbon group having 8 or more and 10 or less carbon atoms. In the chain aliphatic hydrocarbon group, a part or all of the hydrogen atoms may be substituted with a halogen atom(s) (a fluorine atom, etc.), and the chain aliphatic hydrocarbon group may be straight chain or branched chain, but it is preferably a straight-chain aliphatic hydrocarbon group in which a part or all of the hydrogen atoms may be substituted with a fluorine atom(s).

An alkoxy group of the alkoxymonosilane compound is represented by the general formula: RO— (R denotes an alkyl group), and the alkyl group represented by the R is preferably a straight-chain or branched chain alkyl group, and more preferably a straight-chain alkyl group. Furthermore, the number of carbon atoms of the alkyl group represented by the R is not particularly limited. However, from the viewpoint of control at the time of hydrolysis and condensation, the number is preferably 1 or more and 10 or less, more preferably 1 or more and 5 or less, and further preferably 1 or 2. Specific examples of the alkoxy group of the alkoxymonosilane compound include a methoxy group, an ethoxy group, a propoxy group, an isopropoxy group, a butoxy group, a sec-butoxy group, a t-butoxy group, and the like.

The alkoxymonosilane compound is preferably a compound represented by the following formula (1).

$$R^1_n SiX_{4-n} \quad (1)$$

(In the above general formula, $R^1$ each independently is a mono-valent organic group, at least one of $R^1$ is a chain aliphatic hydrocarbon group having 3 or more and 20 or less carbon atoms, in which a part or all of the hydrogen atoms may be substituted with a fluorine atom(s); X is an alkoxy group; and n is an integer of 1 or more and 3 or less.)

The mono-valent organic group of $R^1$ includes an alkyl group, an aromatic hydrocarbon group, an amino group, a monoalkylamino group, a dialkylamino group, and the like.

Hereinafter, a case where $R^1$ is an organic group other than a chain aliphatic hydrocarbon group having 3 or more and 20 or less carbon atoms, in which a part or all of the hydrogen atoms may be substituted with a fluorine atom(s), will be described. The alkyl group is preferably a straight-chain or branched chain alkyl group having 1 or more and 20 or less carbon atoms (preferably, 1 or more and 8 or less carbon atoms), and more preferably a methyl group, an ethyl group, an n-propyl group, and an isopropyl group. The aromatic hydrocarbon group is preferably a phenyl group, a naphthyl group, a biphenylyl group, an anthryl group, and a phenanthrenyl group, more preferably a phenyl group and a naphthyl group, and particularly preferably a phenyl group. The alkyl group included in the monoalkylamino group or the dialkylamino group may include a nitrogen atom, an oxygen atom, or a carbonyl group in the chain, and may be a straight-chain alkyl group or a branched chain alkyl group. The number of carbon atoms of the alkyl group included in the monoalkylamino group or the dialkylamino group is not particularly limited, and the number is preferably 1 or more and 20 or less, more preferably 1 or more and 10 or less, and particularly preferably 1 or more and 6 or less.

Next, a case where $R^1$ is a chain aliphatic hydrocarbon group having 3 or more and 20 or less carbon atoms, in which a part or all of the hydrogen atoms may be substituted with a fluorine atom(s), will be described. The number of carbon atoms of such a chain aliphatic hydrocarbon group is more preferably 6 or more and 18 or less, further preferably 7 or more and 12 or less, particularly preferably 8 or more and 11 or less, and the most preferably 8 or more and 10 or less, as described above. Such a chain aliphatic hydrocarbon group may be straight-chain or branched chain, and preferably is straight-chain. Suitable examples of the chain aliphatic hydrocarbon groups in which a part or all of the hydrogen atoms may be substituted with a fluorine atom(s) include straight-chain alkyl groups such as an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, and an n-octadecyl group, and fluoridated straight-chain alkyl groups in which a hydrogen atom on these straight-chain alkyl groups is substituted with a fluorine atom.

X is preferably an alkoxy group having 1 or more and 5 or less carbon atoms. Specific examples of X include alkoxy groups such as a methoxy group, an ethoxy group, an n-propoxy group, an isopropoxy group, an n-butoxy group, a sec-butoxy group, and a t-butoxy group. Among them, particularly, from the viewpoint of control at the time of hydrolysis or condensation, a methoxy group, an ethoxy group, an isopropoxy group or a butoxy group is preferable. Furthermore, the alkoxymonosilane compound is preferably a trialkoxymonosilane compound.

The alkoxymonosilane compounds exemplified above can be used alone or by mixing two or more thereof. Specific examples of such an alkoxymonosilane compound include propyltrimethoxysilane 3,3,3-trifluoropropyltrimethoxysilane, n-hexyltrimethoxysilane, n-octyltrimethoxysilane, n-dodecyltrimethoxysilane, n-octadecyltrimethoxysilane, and the like, and preferably n-hexyltrimethoxysilane, n-octyltrimethoxysilane, n-dodecyltrimethoxysilane, or n-octadecyltrimethoxysilane, and more preferably n-octyltrimethoxysilane, n-dodecyltrimethoxysilane, or n-octadecyltrimethoxysilane.

Use of the above-described alkoxymonosilane compound enables formation of a monomolecular film on a substrate surface. When a monomolecular film derived from an alkoxymonosilane compound having a hydrophobic group is formed on the substrate surface, hydrophobicity of the substrate surface can be improved to a high degree. As a result, selectivity of hydrophobicity improvement in two or more adjacent regions having different materials on the substrate surface can be improved. Particularly, from the viewpoint of the high degree of hydrophobicity improvement, it is preferable that in the monomolecular film, a network of siloxane bonds is formed in the plane direction of the substrate. Such a monomolecular film is a so-called self-assembled monolayer film. In the self-assembled monolayer film, since residues derived from the alkoxymonosilane compound are densely included and the residues are bonded to each other by a siloxane bond, the monomolecular film is firmly bonded to the substrate surface. As a result, a particularly high degree of the hydrophobicity improvement can be expressed. Such a self-assembled monolayer film can be formed by using a trialkoxymonosilane compound and/or a dialkoxymonosilane compound as the silylation agent (A) as described above.

Formation of the monomolecular film can be confirmed based on, for example, a change in film thickness, a change in contact angle, and X-ray photoelectron spectroscopy (XPS). A film thickness of the monomolecular film having hydrophobicity can be, for example, 20 nm or less, preferably 10 nm or less, more preferably 5 nm or less, and further preferably 3 nm or less. The lower limit value is not particularly limited as long as the effect of the present invention is not impaired, but it is, for example, 0.1 nm or more, and typically 0.5 nm or more.

(Compound Represented by General Formula (2))

One example of a silylation agent used in this aspect includes a compound represented by the following general formula (2).

[Chem. 1]

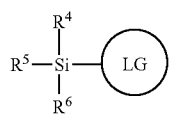

(2)

(In the above general formula (2), $R^4$, $R^5$ and $R^6$ each independently represents a hydrogen atom, a nitrogen-containing group, or an organic group; and the total number of carbon atoms included in $R^4$, $R^5$ and $R^6$ is 1 or more. LG represents a leaving group.)

The compound represented by the general formula (2) is reacted with a functional group (typically, an —OH group, an —NH$_2$ group, and the like) on the surface of the substrate while causing a leaving group included in the structure thereof to be detached, and can produce a chemical bond. Examples of the leaving group include a nitrogen-containing group having a nitrogen atom and a halogen group bonded to a silicon atom in the general formula (2), an acyloxy group and a sulfoxy group having an oxygen atom, or derivatives thereof, a hydrogen atom, and an azide group, bonded to a silicon atom in the general formula (2).

More specifically, as the compound having a substituent represented by the above general formula (2), a compound represented by the following general formulae (3) to (6) can be used.

[Chem. 2]

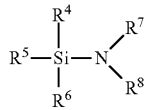

(3)

(In the above general formula (3), $R^4$, $R^5$, and $R^6$ are the same as in the above general formula (2); $R^7$ and $R^8$ each independently represent a hydrogen atom, a saturated or unsaturated alkyl group, a saturated or unsaturated cycloalkyl group, an acetyl group, or a saturated or unsaturated hetero-cycloalkyl group. $R^7$ and $R^8$ may bond together to form a ring structure including a nitrogen atom. Ring-constituent atoms constituting the ring structure may include a hetero atom other than a nitrogen atom.)

[Chem. 3]

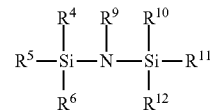

(4)

(In the above general formula (4), $R^4$, $R^5$ and $R^6$ are the same as in the above general formula (2); $R^9$ represents a hydrogen atom, a methyl group, a trimethylsilyl group, or a dimethylsilyl group; $R^{10}$, $R^{11}$ and $R^{12}$ each independently represent a hydrogen atom or an organic group; and the total number of carbon atoms contained in $R^{10}$, $R^{11}$ and $R^{12}$ is 1 or more.)

[Chem. 4]

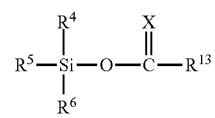

(5)

(In the above general formula (5), $R^4$, $R^5$ and $R^6$ are the same as in the above general formula (2); X represents O, $CHR^{14}$, $CHOR^{14}$, $CR^{14}R^{14}$, or $NR^{15}$; $R^{13}$ and $R^{14}$ each independently represent a hydrogen atom, a saturated or unsaturated alkyl group, a saturated or unsaturated cycloalkyl group, a trialkylsilyl group, a trialkylsiloxy group, an alkoxy group, a phenyl group, a phenylethyl group, or an acetyl group; and $R^{15}$ represents a hydrogen atom, an alkyl group, or a trialkylsilyl group.)

[Chem. 5]

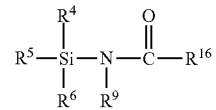

(6)

(In the above general formula (6), $R^4$, $R^5$ and $R^6$ are the same as in the above general formula (2); $R^9$ is the same as in the above general formula (4); and $R^{16}$ represents a hydrogen atom, a saturated or unsaturated alkyl group, or a trialkylsilyl amino group.)

Note here that in the alkyl group and the cycloalkyl group in the general formulae (3) to (6), a part or all of the hydrogen atoms bonded to carbon atoms constituting the alkyl group and the cycloalkyl group may be substituted with a fluorine atom(s).

Examples of the compound represented by the above general formula (3) include (N,N-dimethylamino)trimethylsilane, (N,N-dimethylamino) dimethylsilane, (N,N-dimethylamino)monomethylsilane, (N,N-diethylamino)trimethylsilane, tert-butylaminotrimethylsilane, (alylamino)trimethylsilane, (trimethylsilyl)acetamide, (N—N-dimethylamino)dimethylvinylsilane, (N,N-dimethylamino)dimethylpropylsilane, (N,N-dimethylamino)dimethyloctylsilane, (N,N-dimethylamino)dimethylphenylethylsilane, (N,N-dimethylamino)dimethylphenylsilane, (N,N-dimethylamino)dimethyl-tert-butylsilane, (N,N-dimethylamino)triethylsilane, trimethylsilanamine, monomethyl silyl imidazole, dimethylsilyl imidazole, trimethylsilyl imidazole, monomethyl silyl triazole, dimethylsilyl triazole, trimethylsilyl triazole, N-(trimethylsilyl)dimethylamine, trimethylsilyl morpholine, and the like.

Examples of the compound represented by the above general formula (4) include hexamethyl disilazane, N-methyl-hexamethyl disilazane, 1,1,3,3-tetramethyl disilazane, 1,3-dimethyl disilazane, 1,2-di-N-octyltetramethyl disilazane, 1,2-divinyltetramethyl disilazane, heptamethyl disilazane, nonamethyl trisilazane, tris(dimethylsilyl)amine, tris(trimethylsilyl)amine, pentamethylethyl disilazane, pentamethylvinyl disilazane, pentamethylpropyl disilazane, pentamethylphenylethyl disilazane, pentamethyl-tert-butyl disilazane, pentamethylphenyl disilazane, trimethyltriethyl disilazane, and the like.

Examples of the silylation agent represented by the above general formula (5) include trimethylsilyl acetate, dimethylsilyl acetate, monomethylsilyl acetate, trimethylsilyl propionate, trimethylsilyl butyrate, trimethylsilyloxy-3-pentene-2-one, and the like.

Examples of the silylation agent represented by the above general formula (6) include bis(trimethylsilyl)urea, N-trimethylsilyl acetamide, N-methyl-N-(trimethylsilyl)trifluoroacetamide, and the like.

Among the above-described various compounds, from the viewpoint of easy availability, high handleability, and the like, the compound represented by the general formula (3) and the compound represented by the general formula (4) are used particularly preferably.

Furthermore, among the compounds represented by the general formula (4), a compound having a hydrogen atom as $R^4$ and/or $R^{10}$ is one of the preferable examples. When such a compound is used, it is considered that after the compound is expanded on the substrate, the network among molecules is easily formed. Also with such a contribution, after bonding on the substrate once, removal thereof tends to be difficult even when heated. Thus, even when the surface-treated substrate is subjected to a high-temperature process such as an atomic layer deposition method as described later, a silylation site is kept stably.

Furthermore, among the compounds represented by the general formula (3), a silazane compound represented by the following general formula (3-a) in which $R^5$ is a nitrogen-containing group and two nitrogen atoms are bonded to a silicon atom is also preferable. When such a compound is used, each of the two nitrogen atoms included in the compound can form a chemical bond to a functional group on the substrate. In other words, two atomic bonds of one silicon atom can be bonded to the substrate, thus forming firmer bonding between the substrates. In addition, when such a firm bonding can be formed, after bonding on the substrate once, removal thereof tends to be difficult even when heated. Thus, even when the surface-treated substrate is subjected to a high-temperature process such as an atomic layer deposition method as described later, the silylation site is kept stably. Furthermore, as defined below, $R^4$ and $R^6$ in the general formula (3-a) may be a nitrogen-containing group similar to $R^5$ in the general formula (3), and may enhance interaction between a silylation agent and a substrate depending on the intended use.

[Chem. 6]

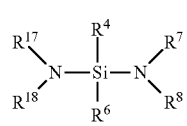

(3-a)

(In the above general formula (3-a), $R^4$ and $R^6$ each independently represent a hydrogen atom, a nitrogen-containing group, or an organic group; and the total number of carbon atoms included in $R^4$ and $R^6$ is 1 or more. $R^7$, $R^8$, $R^{17}$, and $R^{18}$ each independently represent a hydrogen atom, a saturated or unsaturated alkyl group, a saturated or unsaturated cycloalkyl group, an acetyl group, or a saturated or unsaturated hetero-cycloalkyl group. $R^7$ and $R^8$ or $R^{17}$ and $R^{18}$ may bond together to form a ring structure including a nitrogen atom. Ring-constituent atoms constituting the ring structure may include a hetero atom other than a nitrogen atom.)

Furthermore, when focusing on a substituent bonding to a silicon atom, it is preferable to use a silylation agent in which a so-called bulky (large bulk) substituent having a large number of carbon atoms included in the substituent bonds to the silicon atom. When the surface treatment agent contains such a silylation agent, the hydrophobicity of the surface of the substrate that is subjected to treatment with this surface treatment agent can be increased. This can improve selectivity in the hydrophobicity improvement between two or more adjacent regions having different materials on the substrate surface.

Consequently, in the above general formula (2), the total number of carbon atoms contained in $R^4$, $R^5$, and $R^6$ is preferably 3 or more. Among them, from the viewpoint of obtaining sufficient reactivity in the silylation reaction, it is preferable that any one of $R^4$, $R^5$, and $R^6$ in the above general formula (2) is an organic group having 2 or more carbon atoms (hereinafter referred to as a "specific organic group" in this paragraph), and the remaining two is each independently a methyl group or an ethyl group. As the specific organic group, an alkyl group having 2 or more and 20 or less carbon atoms that may have a branch and/or substituent, a vinyl group that may have a substituent, an aryl group that may have a substituent, and the like are exemplified. The number of carbon atoms of the specific organic group is more preferably 2 or more and 12 or less, further preferably 2 or more and 10 or less, and particularly preferably 2 or more and 8 or less.

From such a viewpoint, among the silylation agents having the substituent represented by the general formula (2) exemplified above, N,N-dimethylaminodimethylvinylsilane, N,N-dimethylaminodimethylpropylsilane, N,N-dimethylaminodimethyloctylsilane, N,N-dimethylaminodimethylphenylethylsilane, N,N-dimethylaminodimethylphenylsilane, N,N-dimethylaminodimethyl-tert-butylsilane, N,N-dimethylaminotriethylsilane, N,N-dimethylaminotrimethylsilane, and the like, are preferably exemplified.

(Cyclic Silazane Compound)

Examples of the cyclic silazane compound include a cyclic disilazane compound such as 2,2,5,5-tetramethyl-2,5-disila-1-aza-cyclopentane and 2,2,6,6-tetramethyl-2,6-disila-1-aza-cyclohexane; a cyclic trisilazane compound such as 2,2,4,4,6,6-hexamethylcyclotrisilazane and 2,4,6-trimethyl-2,4,6-trivinylcyclotrisilazane; a cyclic tetrasilazane compound such as 2,2,4,4,6,6,8,8-octamethylcyclotetrasilazane; and the like. Among such cyclic silazane compounds, a compound having a partial structure in which two or more nitrogen-containing groups are bonded to one silicon atom can be preferably used. In this case, similar to the general formula (3-a) described above, firmer bonding can be formed between the silylation agent and the substrate. After bonding on the substrate once, removal thereof tends to be difficult even when heated. Thus, as a result, even when the surface-treated substrate is subjected to a high-temperature process such as an atomic layer deposition method as described later, the silylation site is kept stably.
(Other Silylation Agents)

Besides the compounds described above, a compound represented by the general formula (7), (8) or (9) can be used as the silylation agent.

[Chem. 7]

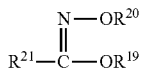

(7)

(In the above general formula (7), $R^{19}$ and $R^{20}$ each independently represents a hydrogen atom, an alkyl group, and a trialkylsilyl group; at least one of $R^{19}$ and $R^{20}$ represents a trialkylsilyl group; and $R^{21}$ represents an aliphatic hydrocarbon group having 1 or more and 10 or less carbon atoms, in which a part or all of the hydrogen atoms may be substituted with a fluorine atom(s).)

[Chem. 8]

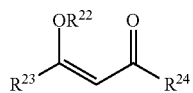

(8)

(In the above general formula (8), $R^{22}$ represents a trialkylsilyl group; and $R^{23}$ and $R^{24}$ each independently represent a hydrogen atom or an organic group.)

[Chem. 9]

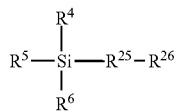

(9)

(In the above general formula (9), $R^4$, $R^5$, and $R^6$ are the same as those in the above general formula (2); $R^{25}$ represents a single bond or an organic group; $R^{26}$ is not present or represents —$SiR^{27}R^{28}R^{29}$, if it is present. $R^{27}$, $R^{28}$, and $R^{29}$ each independently represent a hydrogen atom, a nitrogen-containing group, or an organic group.)

Examples of the compounds represented by the above general formula (7) include bis(trimethylsilyl)trifluoroacetamide, trimethylsilyl methyl acetamide, bistrimethylsilyl acetamide, and the like; and examples of the compound represented by the above general formula (8) include 2-trimethylsiloxypenta-2-en-4-one and the like. Examples of the compounds represented by the above general formula (9) include 1,2-bis(dimethylchlorosilyl)ethane, tert-butyldimethylchlorosilane, and the like.

The silylation agents exemplified above can be used singly or in a mixture of two or more thereof.

The content of the silylation agent (A) in the surface treatment agent is not particularly limited as long as the effect of the present invention is not impaired, but the content with respect to the total amount of the surface treatment agent is preferably 0.001% by mass or more, more preferably 0.01% by mass or more, further preferably 0.1% by mass or more, particularly preferably 0.5% by mass or more, and the most preferably 1.0% by mass or more. The upper limit value of the content of the silylation agent (A) in the surface treatment agent is not particularly limited as long as the effect of the present invention is not impaired, but it is, for example, 30% by mass or less, 15% by mass or less, 10% by mass or less, and typically 8% by mass or less.

[Nitrogen-Containing Heterocyclic Compound (B)]

The surface treatment agent includes the nitrogen-containing heterocyclic compound (B). When the surface treatment agent includes the nitrogen-containing heterocyclic compound (B), a silylation reaction by the silylation agent, hydrolysis or condensation of the alkoxymonosilane compound, and bonding to the substrate surface, can be promoted, and the substrate surface can be activated by pulling out hydrogen from the hydroxyl group existing on the substrate surface. As a result, it is possible to selectively improve hydrophobicity between two or more adjacent regions having different materials on the substrate surface.

The nitrogen-containing heterocyclic compound (B) is not particularly limited as long as it is a compound including a nitrogen atom in the ring structure thereof, but from the viewpoint of selectivity in hydrophobicity improvement between two or more adjacent regions having different materials on the substrate surface, the nitrogen-containing heterocyclic compound (B) includes preferably 2 or more and 5 or less nitrogen atoms, more preferably 2 or more and 4 or less nitrogen atoms, and further preferably 2 or 3 nitrogen atoms. The nitrogen-containing heterocyclic compound (B) may include a hetero atom other than a nitrogen atom, for example, an oxygen atom, a sulfur atom, and the like, in the ring thereof. The nitrogen-containing heterocyclic compound (B) can employ a compound that does not typically include a silicon atom in its structure. The nitrogen-containing heterocyclic compound (B) is preferably a compound including a nitrogen-containing heterocyclic ring having an aromatic property, from the viewpoint of hydrophobization of the surface.

The nitrogen-containing heterocyclic compound (B) may be a compound in which two or more rings are bonded by a single bond, or a compound bonded by bi- or poly-valent linking group. In this case, two or more rings bonded by a linking group are only required to include at least one nitrogen-containing heterocycle. In the poly-valent linking group, divalent linking groups are preferable from the viewpoint that the steric hindrance between rings is small. Specific examples of the divalent linking group include an alkylene group having 1 or more and 6 or less carbon atoms, —CO—, —CS—, —O—, —S—, —NH—, —N=N—, —CO—O—, —CO—NH—, —CO—S—, —CS—O—, —CS—S—, —CO—NH—CO—, —NH—CO—NH—, —SO—, —SO$_2$—, and the like. The number of rings included in the compound in which two or more rings are bonded by the poly-valent linking group is preferably 4 or less, more preferably 3 or less, and the most preferably 2 from the viewpoint of easiness in preparing a uniform surface treatment agent. Note here that, in, for example, a condensed ring such as a naphthalene ring, the number of rings is 2.

The nitrogen-containing heterocyclic compound (B) may be a nitrogen-containing heterocyclic compound in which two or more rings are condensed. In this case, at least one ring among the rings constituting the condensed ring is only required to be a nitrogen-containing heterocycle. The number of rings included in the nitrogen-containing heterocyclic compound in which two or more rings are condensed is preferably 4 or less, more preferably 3 or less, and the most preferably 2 from the viewpoint of easiness in preparing a uniform surface treatment agent.

From the viewpoint of surface hydrophobization, the nitrogen-containing heterocyclic compound (B) preferably includes a condensed polycyclic ring including a nitrogen-containing five-membered ring or a nitrogen-containing five-membered ring skeleton.

As the heterocyclic ring of the nitrogen-containing heterocyclic compound (B), imidazole that may have a substituent, triazol that may have a substituent, tetrazole that may have a substituent, benzotriazole that may have a substituent, or pyrazole that may have a substituent is preferable, and more preferable is one or more selected from the group consisting of imidazole that may have a substituent, triazol that may have a substituent, and tetrazole that may have a substituent.

Examples of the substituents include an alkyl group having 1 or more and 6 or less carbon atoms, a cycloalkyl group having 3 or more and 8 or less carbon atoms, an alkoxy group having 1 or more and 6 or less carbon atoms, a cycloalkyloxy group having 3 or more and 8 or less carbon atoms, an aryl group having 6 or more and 20 or less carbon atoms, an aralkyl group having 7 or more and 20 or less carbon atoms, an alkyl halide group having 1 or more and 6 or less carbon atoms, an aliphatic acyl group having 2 or more and 7 or less carbon atoms, an aliphatic acyl halide group having 2 or more and 7 or less carbon atoms, an aryl carbonyl group having 7 or more and 20 or less carbon atoms, a carboxyalkyl group having 2 or more and 7 or less carbon atoms, a halogen atom, a hydroxyl group, a mercapto group, an alkylthio group having 1 or more and 6 or less carbon atoms, an amino group, a monoalkyl amino group including an alkyl group having 1 or more and 6 or less carbon atoms, a dialkyl amino group including an alkyl group having 1 or more and 6 or less carbon atoms, a nitro group, a cyano group, and the like. The nitrogen-containing heterocyclic compound (B) may have a plurality of substituents on the heterocycle thereof. When a plurality of substituents are included, the plurality of substituents may be the same as or different from each other. When these substituents include an aliphatic hydrocarbon ring, an aromatic hydrocarbon ring, or the like, these rings may further include the same substituents as the substituents which the nitrogen-containing heterocyclic compound (B) may have.

Particularly suitable examples of the heterocyclic compound include a compound represented by the following formula.

[Chem. 10]

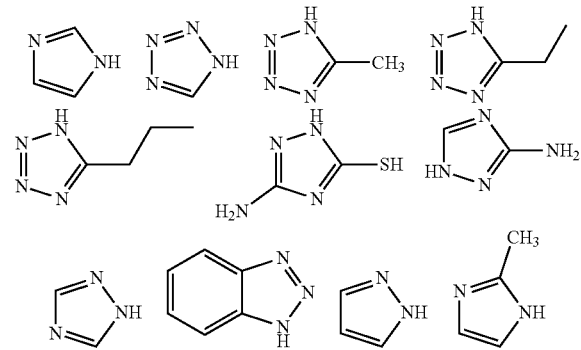

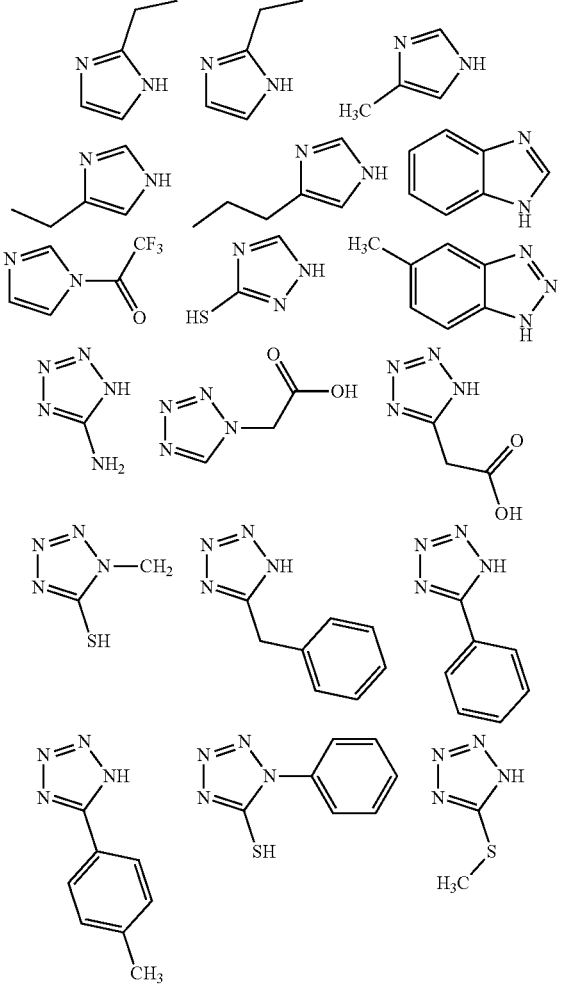

The content of the nitrogen-containing heterocyclic compound (B) in the surface treatment agent is not particularly limited as long as the effect of the present invention is not impaired, but the content with respect to the total amount of the surface treatment agent is preferably 0.001% by mass or more, more preferably 0.01% by mass or more, further preferably 0.1% by mass or more, particularly preferably 0.5% by mass or more, and the most preferably 1.0% by mass or more. The upper limit value of the content of the nitrogen-containing heterocyclic compound (B) in the surface treatment agent is not particularly limited as long as the effect of the present invention is not impaired, but it is, for example, 30% by mass or less, 15% by mass or less, and 10% by mass or less, and typically 5% by mass or less.

[Solvent]

From the viewpoint that when the surface treatment agent includes a solvent, the surface treatment of a substrate can be carried out easily by a dipping method, a spin coating method, and the like, the surface treatment agent preferably contains a solvent.

Specific examples of the solvent include: sulfoxides such as dimethylsulfoxide; sulfones such as dimethylsulfone, diethylsulfone, bis(2-hydroxyethyl)sulfone, and tetramethylene sulfone; amides such as N,N-dimethylformamide, N-methylformamide, N,N-dimethylacetamide, N-methylacetamide, and N,N-dimethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; dialkyl glycol ethers such as dimethyl glycol, dimethyl diglycol, dimethyl trigylcol, methylethyl diglycol, diethyl glycol, and triethylene glycol butyl methyl ether; monoalcohol-based solvents such as methanol, ethanol, n-propanol, isopropanol, n-butanol, isobutanol, sec-butanol, tert-butanol, n-pentanol, isopentanol, 2-methyl butanol, sec-pentanol, tert-pentanol, 3-methoxybutanol, 3-methyl-3-methoxybutanol, n-hexanol, 2-methyl pentanol, sec-hexanol, 2-ethyl butanol, sec-heptanol, 3-heptanol, n-octanol, 2-ethyl hexanol, sec-octanol, n-nonyl alcohol, 2,6-dimethyl-4-heptanol, n-decanol, sec-undecyl alcohol, trimethyl nonyl alcohol, sec-tetradecyl alcohol, sec-heptadecyl alcohol, phenol, cyclohexanol, methyl cyclohexanol, 3,3,5-trimethyl cyclohexanol, benzyl alcohol, phenyl methyl carbinol, diacetone alcohol, and cresol; (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate, and propylene glycol monoethyl ether acetate; other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol diethyl ether, tetraethylene glycol dimethyl ether, and tetrahydrofuran; ketones such as methyl ethyl ketone, cyclohexanone, 2-heptanone, and 3-heptanone; alkyl lactate esters such as methyl 2-hydroxypropionate and ethyl 2-hydroxypropionate; other esters such as 2-hydroxy-2-methylpropionic acid ethyl, 3-methoxypropionic acid methyl, 3-methoxypropionic acid ethyl, 3-ethoxypropionic acid methyl, 3-ethoxypropionic acid ethyl, ethoxyacetic acid ethyl, hydroxyacetic acid ethyl, 2-hydroxy-3-methylbutanoic acid methyl, 3-methoxybutyl acetate, 3-methyl-3-methoxy-1-butyl acetate, 3-methyl-3-methoxybutyl propionate, ethyl acetate, n-propyl acetate, i-propyl acetate, n-butyl acetate, i-butyl acetate, n-pentyl acetate, n-hexyl acetate, n-heptyl acetate, n-octyl acetate, n-pentyl formate, i-pentyl acetate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, and propylene glycol diacetate; lactones such as β-propiolactone, γ-butyrolactone, and δ-pentyrolactone; straight-chain, branched chain, or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methyl cyclohexane; aromatic hydrocarbons such as benzene, toluene, xylene, 1,3,5-trimethyl benzene, and naphthalene; terpenes such as p-menthane, diphenyl menthane, limonene, terpinene, bornane, norbornane and pinane; and the like. These solvents can be used alone or by mixing two or more thereof.

Among the solvents, a solvent that can dissolve the silylation agent (A) and the nitrogen-containing heterocyclic compound (B), and give less damage to the surface of the substrate (organic pattern, inorganic pattern, and the like) is preferable. As the solvent, from the viewpoint of dissolving of both the silylation agent (A) and the nitrogen-containing heterocyclic compound (B) and selectivity in hydrophobicity improvement between two or more adjacent regions having different materials in the substrate surface, a solvent having a dielectric constant of 1 or more and 25 or less is preferable, a solvent having a dielectric constant of 2 or more and 20 or less is more preferable, a solvent having a dielectric constant of 3 or more and 15 or less is further preferable, a solvent having a dielectric constant of 4 or more and 10 or less is particularly preferable, and a solvent having a dielectric constant of 5 or more and 8 or less is the most preferable.

As a solvent satisfying the above-mentioned dielectric constant, 3-methyl-3-methoxy-1-butyl acetate, ethyl acetate, propylene glycol monomethyl ether acetate, propylene glycol monomethyl ether, diethylene glycol monomethyl ether, isopropanol or methyl ethyl ketone is preferable, and 3-methyl-3-methoxy-1-butyl acetate, ethyl acetate or propylene glycol monomethyl ether acetate is more preferable.

<<Method for Forming Film Region-Selectively on Substrate>>

Next, a method for forming a film region-selectively on a substrate using the surface treatment method according to the first aspect will be described. In this aspect, the method for forming a film region-selectively on a substrate includes:

treating the surface of the substrate by the surface treatment method according to the first aspect; and forming a film on a surface-treated surface of the substrate by the ALD method;

wherein a deposition amount of materials of the film is made to be different region-selectively.

As a result of the surface treatment according to the first aspect, the contact angle of water (preferably, hydrophobicity) between the two or more regions becomes different. Thus, in this aspect, between the two or more regions, a deposition amount of materials forming the film can be made different region-selectively with respect to the substrate surface. Specifically, it is preferable that in a region in which the contact angle of water (preferably, hydrophobicity) is greater than that of the other region(s) in the two or more regions, adsorption (preferably, chemical adsorption) of a film-forming material by the ALD method does not easily occur in the above-mentioned region on the substrate surface, difference occurs in the deposition amount of the film-forming materials in the two or more regions, and as a result, the deposition amount of film-forming materials is different region-selectively with respect to the substrate. Examples of the chemical adsorption include chemical adsorption to a hydroxyl group, and the like.

In the two or more regions, a region in which a contact angle of water (preferably, hydrophobicity) tends to be greater than the other region(s) includes a region including at least one selected from the group consisting of Si, SiN, Ox, TiN, TaN, Ge, and SiGe. In the two or more regions, a region in which a contact angle of water (preferably, hydrophobicity) tends to be lesser than the other region(s) includes a region including at least one selected from the group consisting of W, Co, Al, Ni, Ru, Cu, TiN, and TaN.

(Film Formation by ALD Method)

A film formation method by the ALD method is not particularly limited, but it is preferably a thin-film formation method by adsorption (preferably, chemical adsorption) using at least two gas-phase reaction substances (hereinafter, also simply referred to as a "precursor gas"). Specific examples of the method include a method including the following steps (a) and (b), and repeating the following steps (a) and (b) at least once (one cycle) until a desired film thickness is obtained:

(a) a step of exposing a substrate that has been subjected to surface treatment by the method of the first aspect to a pulse of a first precursor gas, and (b) a step of exposing the substrate to a pulse of a second precursor gas, subsequent to the step (a).

After the step (a) and before the step (b), a plasma treatment step, and a step of removing or discharging (purging) the first precursor gas and the reacted product thereof with a carrier gas, the second precursor gas, and the like, may be or may not be included. After the step (b), a plasma treatment step, a step of removing or purging the second precursor gas and the reacted product thereof with a carrier gas, and the like, may be or may not be included. Examples of the carrier gas include an inert gas such as nitrogen gas, argon gas, and helium gas.

It is preferable that each pulse for each cycle and each formed layer are self-controlling, and it is more preferable that each formed layer is a mono-atomic layer. A thickness of the mono-atomic layer can be, for example, 5 nm or less, preferably 3 nm or less, more preferably 1 nm or less, and further preferably 0.5 nm or less.

As the first precursor gas, an organic metal, a metal halide, a metal oxyhalide, and the like are exemplified. Specific examples thereof include tantalum pentaethoxide, tetrakis (dimethylamino)titanium, pentakis(dimethylamino)tantalum, tetrakis(dimethylamino)zirconium, tetrakis (dimethylamino) hafnium, tetrakis(dimethylamino)silane, copper hexafluoroacetyl acetonate vinyltrimethylsilane, $Zn(C_2H_5)_2$, $Zn(C_2H_5)_2$, $Zn(CH_3)_2$, TMA (trimethyl aluminum), $TaCl_5$, $WF_6$, $WOCl_4$, $CuCl$, $ZrCl_4$, $AlCl_3$, $TiCl_4$, $SiCl_4$, $HfCl_4$, and the like.

As the second precursor gas, a precursor gas capable of decomposing the first precursor or removing a ligand of the first precursor is exemplified. Specific examples thereof include $H_2O$, $H_2O_2$, $O_2$, $O_3$, $NH_3$, $H_2S$, $H_2Se$, $PH_3$, $AsH_3$, $C_2H_4$, $Si_2H_6$, or the like.

The exposure temperature in the step (a) is not particularly limited, but it is, for example, 100° C. or higher and 800° C. or lower, preferably 150° C. or higher and 650° C. or lower, more preferably 200° C. or higher and 500° C. or lower, and further preferably 225° C. or higher and 375° C. or lower.

The exposure temperature in the step (b) is not particularly limited, but it is substantially equal or equal to or more than the exposure temperature in the step (a).

The film formed by the ALD method is not particularly limited, but examples of the film include a film including a pure element (for example, Si, Cu, Ta, and W), a film including an oxide (for example, $SiO_2$, $GeO_2$, $HfO_2$, $ZrO_2$, $Ta_2O_5$, $TiO_2$, $Al_2O_3$, $ZnO$, $SnO_2$, $Sb_2O_5$, $B_2O_3$, $In_2O_3$, and $WO_3$), a film including a nitride (for example, $Si_3N_4$, TiN, AlN, BN, GaN, and NbN), a film including a carbide (for example, SiC), a film including a sulfide (for example, CdS, ZnS, MnS, $WS_2$, and PbS), a film including a selenide (for example, CdSe and ZnSe), a film including a phosphide (GaP and InP), a film including an arsenate (for example, GaAs and InAs), or mixtures thereof, and the like.

EXAMPLES

Hereinafter, the present invention will be described more specifically by showing Examples, but the scope of the present invention is not limited to these Examples.

Examples 1 to 4 and Comparative Example 1

(Preparation of Surface Treatment Agent)

In 3-methyl-3-methoxy-1-butyl acetate (MMBA) as a solvent, 7.8% by mass of n-octyltrimethoxysilane as the silylation agent (A) and 1.0% by mass of the nitrogen-containing heterocyclic compound (B) (hereinafter, also simply referred to as "compound (B)") described in Table 1 were mixed uniformly so as to prepare surface treatment agents of Examples 1 to 4 and Comparative Example 1

(Surface Treatment)

According to the following method using the obtained surface treatment agents of Examples 1 to 4 and Comparative Example 1, surface treatment was carried out on a silicon nitride substrate (SiN), a silicon thermal oxide film substrate (Ox), and a tungsten substrate (W). Specifically, each substrate was dipped in an HF aqueous solution having a concentration of 0.5% by mass at 25° C. for one minute to carry out pretreatment. After the pretreatment, the substrate was cleaned with ion-exchanged distilled water for one minute. The substrate after cleaning with water was dried by nitrogen flow. The substrate after drying was dipped in each of the surface treatment agents at 60° C. for 10 minutes to carry out the surface treatment of the substrate. The substrate after surface treatment was cleaned with isopropanol for one minute, and then cleaned with ion-exchanged distilled water for one minute. The cleaned substrate was dried by nitrogen flow so as to obtain a surface-treated substrate.

(Measurement of Contact Angle of Water)

The contact angles of water of each substrate after the HF pretreatment and each substrate after the surface treatment were measured. The contact angle of water was measured using Dropmaster 700 (manufactured by Kyowa Interface Science Co., Ltd.) as follows: a pure water droplet (2.0 μL) was dropped onto a surface-treated surface of a substrate, and the contact angle after 2 seconds of dropping was measured. Results are shown in Table 1. Note here that the contact angle difference) (°) in Table 1 is a value obtained by subtracting a latter value of the contact angle of water after treatment of the substrate from a former value of the contact angle of water after treatment of the substrate.

TABLE 1

|  | Silylation agent (A) | Compound (B) | Surface treatment conditions | Water contact angle (°) | | | Contact angle difference (°) | | |
| --- | --- | --- | --- | --- | --- | --- | --- | --- | --- |
|  |  |  |  | SiN | Ox | W | Ox—SiN | Ox—W | SiN—W |
|  | After HF-pretreatment | None | None | 28.6 | 8.1 | 24.2 | −20.5 | −16.1 | 4.4 |
| Comparative Example 1 | n-octyltrimethoxysilane | None | 60° C.10 minutes | 31.4 | 51.6 | 23.5 | 20.2 | 28.1 | 7.9 |
| Example 1 | n-octyltrimethoxysilane | Imidazole | 60° C.10 minutes | 57.5 | 95.5 | 33.9 | 38.0 | 61.6 | 23.6 |
| Example 2 | n-octyltrimethoxysilane | Triazole | 60° C.10 minutes | 43.0 | 67.4 | 22.2 | 24.4 | 45.2 | 20.8 |

As is apparent from the results shown in Table 1, it is shown that the water contact angle difference between the W substrate and the SiN or Ox substrate is larger in a case where the surface treatment agent of Examples 1 and 2 containing the compound (B) together with the silylation agent (A) is used as compared with Comparative Example 1 that does not contain the compound (B). It can be said that use of the surface treatment agent of Examples 1 and 2 containing the compound (B) together with the silylation agent (A) is suitably applicable for region-selective film-formation on the substrate surface using the ALD method.

Examples 3 to 7

(Preparation of Surface Treatment Agent)
In 3-methyl-3-methoxy-1-butyl acetate as a solvent, 7.8% by mass of each silylation agent (A) described in the following Table 2, and 1.0% by mass of compound (B) were mixed uniformly so as to prepare surface treatment agents of Examples 3 to 7.
(Surface Treatment)
By using the obtained surface treatment agents of Examples 3 to 7, similar to Examples 1 and 2 and Comparative Example 1, after pretreatment with an HF aqueous solution, surface treatment of a SiN substrate, an Ox substrate, a W substrate, and a titanium nitride substrate (TiN) was carried out, and contact angles of water of each substrate after the HF pretreatment and each substrate after the surface treatment were measured. Measurement of the contact angle of water was carried out in the same manner as mentioned above. Results are shown in the following Table 2. Note here that the contact angle difference (°) in Table 2 is a value obtained by subtracting a latter value of the contact angle of water after treatment of the substrate from a former value of the contact angle of water after treatment of the substrate.

On the other hand, it is shown that after the surface treatment with surface treatment agents of Examples 3 to 7 including various types of silylation agents (A) and imidazole, the water contact angle differences are large, for example, between substrates shown in the column of the contact angle difference in Table 2. From the results, it can be said that a substrate including a plurality of different regions using the surface treatment agent containing the silylation agent (A) and the compound (B) is suitably applicable for region-selective film-formation of the substrate surface using the ALD method. In particular, it can be said that when the surface treatment agents of Examples 5 and 6 in which the number of carbon atoms of the straight-chain alkyl group is 8 and 11 are used, the water contact angle difference with respect to the W substrate, the SiN substrate, the Ox substrate, or the TiN substrate tends to be particularly large.

Example 8

(Preparation of Surface Treatment Agent)
In each of the following solvents, 7.8% by mass of n-octyltrimethoxysilane as the silylation agent (A), and 1.0% by mass of imidazole as the compound (B) were mixed uniformly to prepare a surface treatment agent.
Isopropyl alcohol (IPA)
Methyl ethyl ketone (MEK)
Ethyl acetate
3-methyl-3-methoxybutanol (MMB)
Propylene glycol monomethyl ether (PGME)
Diethylene glycol monomethyl ether (MDG)
Propylene glycol monomethyl ether acetate (PGMEA)
3-methyl-3-methoxy-1-butyl acetate (MMBA)
(Surface Treatment)
By using the obtained surface treatment agents, similar to Examples 1 and 2 and Comparative Example 1, after pretreatment with an HF aqueous solution, surface treatment of

TABLE 2

|  | Silylation agent (A) | Chain length (number of carbon atoms) | Surface treatment conditions | Water contact angle (°) | | | | Contact angle difference (°) | | | |
| --- | --- | --- | --- | --- | --- | --- | --- | --- | --- | --- | --- |
|  |  |  |  | SiN | Ox | W | TiN | Ox—SiN | TiN—SiN | Ox—W | TiN—W |
|  | After HF-pretreatment | None | None | 30.9 | 5.0 | 23.6 | 15.6 | −25.9 | −15.3 | −18.6 | −8 |
| Example 3 | n-propyltrimethoxysilane | 3 | 60° C.10 minutes | 41.3 | 67.5 | 23.5 | — | 26.2 | — | 44.0 | — |
| Example 4 | n-hexyltrimethoxysilane | 6 | 60° C.10 minutes | 35.9 | 68.6 | 14.2 | — | 32.7 | — | 54.4 | — |
| Example 5 | n-octyltrimethoxysilane | 8 | 60° C.10 minutes | 51.8 | 92.6 | 34.8 | 117.6 | 40.8 | 65.8 | 57.8 | 82.8 |
| Example 6 | n-dodecyltrimethoxysilane | 11 | 60° C.10 minutes | 76.5 | 103.0 | 58.9 | 123.5 | 26.5 | 47.0 | 44.1 | 64.6 |
| Example 7 | n-octadecyltrimethoxysilane | 18 | 60° C.10 minutes | 34.3 | 74.9 | 39.8 | 106.2 | 40.6 | 71.9 | 35.1 | 66.4 |

As is apparent from the results shown in Table 2, it is shown that the water contact angle differences between substrates in the SiN substrate, the Ox substrate, the W substrate, and the TiN substrate are small before the surface treatment with the silylation agent (after HF pretreatment).

an Ox substrate and a W substrate was carried out, and the contact angles of water were measured in each substrate after the surface treatment. Measurement of the contact angle of water was carried out in the same manner as mentioned above. Then, relationship of a water contact angle difference between an Ox substrate and a W substrate with respect to the dielectric constant of each solvent is summarized in FIG. 1.

From the relationship shown in FIG. 1 of the water contact angle difference between the Ox substrate and the W substrate with respect to the dielectric constants of various solvents, it is shown that the water contact angle difference tends to be larger in the case of a solvent having the dielectric constant of 1 or more and 25 or less. Specifically, from the viewpoint of selectivity in hydrophobicity improvement between the substrate surfaces having different materials, it is shown that 3-methyl-3-methoxy-1-butyl acetate, ethyl acetate, or propylene glycol monomethyl ether acetate is particularly preferable.

Examples 9 and 10 and Comparative Examples 2 and 3

(Preparation of Surface Treatment Agent)

In 3-methyl-3-methoxy-1-butyl acetate as a solvent, 5.0% by mass of hexamethyldisilazane (HMDS) was mixed uniformly to prepare a surface treatment agent of Comparative Example 2. A surface treatment agent of Example 9 was prepared in the same manner as in Comparative Example 2 except that 3.5% by mass of imidazole as the compound (B) was further mixed. A surface treatment agent of Comparative Example 3 was prepared in the same manner as in Comparative Example 2 except that 5.0% by mass of n-octyltrimethoxysilane, instead of 5.0% by mass of HMDS, was uniformly mixed. A surface treatment agent of Example 10 was prepared in the same manner as in Comparative Example 3 except that 3.5% by mass of imidazole as the compound (B) was further mixed.

(Surface Treatment)

By using the obtained surface treatment agents of Examples 9 and 10 and Comparative Examples 2 and 3, similar to Examples 1 and 2 and Comparative Example 1, after pretreatment with an HF aqueous solution, surface treatment of a Si substrate, a SiN substrate, an Ox substrate, a W substrate, a cobalt (Co) substrate, a titanium nitride (TiN) substrate, and a tantalum nitride (TaN) substrate was carried out, and the contact angles of water of each substrate after the HF pretreatment and each substrate after the surface treatment were measured. Measurement of the contact angle of water was carried out in the same manner as mentioned above. Results are shown in the following Tables 3 and 4. Furthermore, the differences in the contact angles of water between substrates having different materials are shown in the following Tables 4 and 6. Note here that the contact angle differences (°) in Tables 4 and 6 are values obtained by subtracting a latter value of the contact angle of water after treatment of the substrate from a value of a contact angle of water after treatment of the substrate.

TABLE 3

| | Silylation agent (A) | Compound (B) | Water contact angle (°) | | | | | | |
|---|---|---|---|---|---|---|---|---|---|
| | | | Si | SiN | Ox | W | Co | TiN | TaN |
| HF-pretreated substrate | | | 71.7 | 14.6 | 5.1 | 18.2 | 24.1 | 10.5 | 58.7 |
| Comparative Example 2 | HMDS | None | 77.3 | 27.1 | 33.7 | 7.7 | 32.9 | 21.6 | 68.2 |
| Example 9 | HMDS | Imidazole | 83.4 | 65.7 | 97.7 | 5.8 | 35.3 | 9.8 | 65.4 |

TABLE 4

| | Contact angle difference (°) | | | | | | |
|---|---|---|---|---|---|---|---|
| | Si—W | Si—TiN | Si—TaN | Ox—SiN | SiN—W | SiN—Co | SiN—TiN |
| HF-pretreated substrate | 53.5 | 61.2 | 13 | −9.5 | −3.6 | −9.5 | 4.1 |
| Comparative Example 2 | 69.6 | 55.7 | 9.1 | 6.6 | 19.4 | −5.8 | 5.5 |
| Example 9 | 77.6 | 73.6 | 18 | 32 | 59.9 | 30.4 | 55.9 |

| | Contact angle difference (°) | | | | | |
|---|---|---|---|---|---|---|
| | Ox—W | Ox—Co | Ox—TiN | Co—W | Co—TiN | TaN—TiN |
| HF-pretreated substrate | −13.1 | −19 | −5.4 | 5.9 | 13.6 | 48.2 |
| Comparative Example 2 | 26 | 0.8 | 12.1 | 25.2 | 11.3 | 46.6 |
| Example 9 | 91.9 | 62.4 | 87.9 | 29.5 | 25.5 | 55.6 |

As is apparent from the results shown in Table 3, it is shown that the water contact angle differences are larger between the substrates shown in, for example, the contact angle difference column of Table 4 in the case where the surface treatment is carried out with the surface treatment agent of Example 9 including imidazole, as compared with the case where the surface treatment is carried out with the surface treatment agent of Comparative Example 2 which does not include imidazole. It can be said that the surface treatment agent of Example 9 containing the compound (B) together with the silylation agent (A) can be suitably used for region-selective film-formation of the substrate surface using the ALD method.

(Surface Treatment)

Surface treatment of a Si substrate, a SiN substrate, an Ox substrate, and a W substrate was carried out using the obtained surface treatment agent of Example 11, according to the following method. Specifically, each substrate was dipped in an HF aqueous solution having a concentration of 0.5% by mass at 25° C. for one minute so as to carry out pretreatment. After the pretreatment, the substrate was cleaned with ion-exchanged distilled water for one minute. The substrate after cleaning with water was dried by nitrogen flow. Each substrate after drying was dipped in each of the surface treatment agents shown in Table 5 at 25° C. to carry out the surface treatment of the substrate, and the water

TABLE 5

| | Silylation agent | Compound (B) | Water contact angle (°) | | | | | | |
|---|---|---|---|---|---|---|---|---|---|
| | | | Si | SiN | Ox | W | Co | TiN | TaN |
| | HF-pretreated substrate | | 71.7 | 14.6 | 5.1 | 18.2 | 24.1 | 10.5 | 58.7 |
| Comparative Example 3 | n-octyltrimethoxysilane | None | 62.6 | 28.5 | 39.6 | 19.2 | 34.4 | 96.6 | 75.3 |
| Example 10 | n-octyltrimethoxysilane | Imidazole | 91.6 | 52.4 | 81.1 | 9.3 | 36.8 | 85.1 | 72.7 |

TABLE 6

| | Contact angle difference (°) | | | | | | | | | |
|---|---|---|---|---|---|---|---|---|---|---|
| | Si—W | Si—Co | Si—TaN | Ox—SiN | SiN—W | SiN—Co | Ox—W | Ox—Co | Co—W | TaN—W |
| HF-pretreated substrate | 53.5 | 47.6 | 13 | −9.5 | −3.6 | −9.5 | −13.1 | −19.0 | 5.9 | 40.5 |
| Comparative Example 3 | 43.4 | 28.2 | −12.7 | 11.1 | 9.3 | −5.9 | 20.4 | 5.2 | 15.2 | 56.1 |
| Example 10 | 82.3 | 54.8 | 18.9 | 28.7 | 43.1 | 15.6 | 71.8 | 44.3 | 24.5 | 63.4 |

As is apparent from the results shown in Table 5, it is shown that the water contact angle differences are larger between the substrates shown in, for example, the contact angle difference column of Table 6 in the case where the surface treatment is carried out with the surface treatment agent of Example 10 including imidazole as compared with the case where the surface treatment is carried out with the surface treatment agent of Comparative Example 3 which does not include imidazole. It can be said that the surface treatment agent of Example 10 containing the compound (B) together with the silylation agent (A) can be suitably used for region-selective film-formation of the substrate surface using the ALD method.

Note here that when surface treatment of the Si substrate, the SiN substrate, the Ox substrate, the W substrate, the Co substrate, the TiN substrate, and the TaN substrate using a surface treatment agent similar to the surface treatment agent of Example 10 except that the content of imidazole is changed to 0.5% by mass, 1% by mass, and 3% by mass, respectively, results similar to those shown in Tables 5 and 6 are obtained.

Example 11

(Preparation of Surface Treatment Agent)

In 3-methyl-3-methoxy-1-butyl acetate as a solvent, 5.0% by mass of conventional silylation agent HMDS and 3.5% by mass of imidazole were mixed uniformly so as to prepare a surface treatment agent of Example 4.

contact angle for each dipping time of each substrate was carried out. Measurement of the contact angle of water was carried out as mentioned above. Results are shown in the following Table 7.

TABLE 7

| HMDS | Water contact angle(°) | | | | |
|---|---|---|---|---|---|
| Dipping time | 20 seconds | 1 minute | 30 minutes | 1 hour | 4 hour |
| Si substrate | 87.5 | 79.8 | 83.1 | 80.8 | 78.6 |
| SiN substrate | 48.2 | 52.4 | 56.2 | 59.9 | 58.7 |
| Ox substrate | 94.6 | 96.2 | 99.5 | 98.5 | 99.8 |
| W substrate | 5.5 | 5.5 | 5.6 | 5.2 | 5.3 |

As is apparent from the results shown in Table 7, it is shown that difference is large between the water contact angle of the W substrate and the water contact angles of the Si, SiN, or Ox substrate regardless of the dipping time.

Examples 12 to 14

(Surface Treatment Agent)

In 91.5 g of 3-methyl-3-methoxy-1-butyl acetate as a solvent, 5.0% by mass of HMDS and 3.5% by mass of imidazole were mixed uniformly so as to prepare a surface treatment agent of Example 12. A surface treatment agent of Example 13 was prepared in the same manner as in Example 12 except that 5.0% by mass of tetramethyl disilazane (TMDS), instead of 5.0% by mass of HMDS, was uniformly mixed. A surface treatment agent of Example 14 was prepared in the same manner as in Example 12 except that 5.0% by mass of bis(dimethylamine)dimethylsilane (BDMADMS), instead of 5.0% by mass of HMDS, was uniformly mixed.

(Surface Treatment)

Surface treatment of a SiN substrate, an Ox substrate, a Co substrate and a TiN substrate was carried out using the obtained surface treatment agents of Examples 12 to 14, according to the following method. Specifically, each substrate was dipped in an HF aqueous solution having a concentration of 0.5% by mass at 25° C. for one minute so as to carry out pretreatment. After the pretreatment, the substrate was cleaned with ion-exchanged distilled water for one minute. The substrate after cleaning with water was dried by nitrogen flow. The substrate after drying was dipped in each of the surface treatment agents mentioned above at 60° C. for 10 minutes to carry out the surface treatment of the substrate. The substrate after surface treatment was cleaned with isopropanol for one minute, and cleaned with ion-exchanged distilled water for one minute. The cleaned substrate was dried by nitrogen flow to obtain a surface-treated substrate. Measurement of the contact angle of water was carried out in the same manner as mentioned above. Results are shown in the following Table 8.

TABLE 8

| Silylation | | Water contact angle (°) | | | |
| --- | --- | --- | --- | --- | --- |
| Agent (A) | Compound (B) | SiN | Ox | Co | TiN |
| HF-pretreated substrate | | 27.5 | 4.9 | 23.1 | 11.3 |
| Example 12 | HMDS | Imidazole | 56.6 | 95.5 | 29.6 | 15.2 |
| Example 13 | TMDS | Imidazole | 59.5 | 102.4 | 26.2 | 10.7 |
| Example 14 | BDMADMS | Imidazole | 56.4 | 88.4 | 28.8 | 36.4 |

As is apparent from the results shown in Table 8, it is shown that after surface treatment with the surface treatment agent of Examples 12 to 14 including various silylation agents (A) and imidazole, the water contact angle difference with respect to the SiN or the Ox substrate is large. On the other hand, since the water contact angle difference with respect to the Co or TiN substrate is small, it is shown that Examples 12 to 14 have selectivity.

(Evaluation of Heat Resistance)

Using the obtained surface treatment agents of Examples 12 to 14, the heat resistance on a SiN substrate and an Ox substrate was evaluated according to the following method. Specifically, the surface treatment was carried out by dipping the SiN substrate and the Ox substrate in each of the above-mentioned surface treatment agent for one minute at a temperature of 25° C. Thereafter, under nitrogen atmosphere, each substrate was baked on a hot plate at 300° C., and the water contact angle was measured when each baking time had passed. Results are shown in Table 9.

TABLE 9

| Substrate | | Water contact angle(°) | | |
| --- | --- | --- | --- | --- |
| Baking time | | 0 minutes | 20 minutes | 60 minutes |
| Example12 | SiN substrate | 54.7 | 49.8 | 46.5 |
| | Ox substrate | 94.4 | 92.6 | 90.3 |
| Example13 | SiN substrate | 59.5 | 56.4 | 54.6 |
| | Ox substrate | 102.4 | 102.2 | 101.1 |
| Example14 | SiN substrate | 56.4 | 56.3 | 54.9 |
| | Ox substrate | 88.4 | 94.1 | 94.7 |

As is apparent from the results shown in Table 9, when TMDS or BDMADMS is used, during heating time, water contact can be maintained at a high level. Thus, it is considered that when these silylation agents are used, even if a surface-treated substrate is subjected to high-temperature treatment such as an atomic layer deposition method, the silylation site can be maintained stably, and is expected to be suitably used in industrial process.

What is claimed is:

1. A method for region-selectively forming a film on a surface of a substrate, the method comprising:
   treating the surface of the substrate by a surface treatment method; and
   forming a film by an atomic layer deposition method comprising chemical adsorption to a hydroxyl group on the surface of the substrate that has been surface-treated,
   wherein a deposition amount of materials of the film which chemically adsorb to a hydroxyl group on the surface of the substrate differs in a region-selective manner,
   wherein the surface treating method comprises exposing the surface to a surface treatment agent comprising a silylation agent (A) and a nitrogen-containing heterocyclic compound (B),
   wherein the nitrogen-containing heterocyclic compound (B) is a compound that does not include a silicon atom in its structure,
   wherein the surface comprises two or more regions,
   adjacent regions in the two or more regions have different materials and have hydroxy groups, and
   a reaction between the silylation agent and the two or more regions causes contact angles of water to differ from each other with respect to adjacent regions in the two or more regions.

2. The method for region-selectively forming a film on a surface of a substrate according to claim 1, wherein the nitrogen-containing heterocyclic compound (B) is one or more selected from the group consisting of an imidazole that may have a substituent, a triazol that may have a substituent, and a tetrazole that may have a substituent, and wherein the substituents are respectively one or more selected from the group consisting of an alkyl group having 1 or more and 6 or less carbon atoms, a cycloalkyl group having 3 or more and 8 or less carbon atoms, an alkoxy group having 1 or more and 6 or less carbon atoms, a cycloalkyloxy group having 3 or more and 8 or less carbon atoms, an aryl group having 6 or more and 20 or less carbon atoms, an aralkyl group having 7 or more and 20 or less carbon atoms, an alkyl halide group having 1 or more and 6 or less carbon atoms, an aliphatic acyl group having 2 or more and 7 or less carbon atoms, an aliphatic acyl halide group having 2 or more and 7 or less carbon atoms, an aryl carbonyl group having 7 or more and 20 or less carbon atoms, a carboxyalkyl group having 2 or more and 7 or less carbon atoms, a halogen atom, a hydroxyl group, a mercapto group, an alkylthio group having 1 or more and 6 or less carbon atoms, an amino group, a monoalkyl amino group including an alkyl group having 1 or more and 6 or less carbon atoms, a dialkyl amino group including an alkyl group having 1 or more and 6 or less carbon atoms, a nitro group, and a cyano group.

3. The method for region-selectively forming a film on a surface of a substrate according to claim 1, wherein the silylation agent (A) is an alkoxymonosilane compound having a hydrophobic group bonded to a silicon atom.

4. The method for region-selectively forming a film on a surface of a substrate according to claim 3, wherein the alkoxymonosilane compound is a trialkoxymonosilane compound.

5. The method for region-selectively forming a film on a surface of a substrate according to claim 3, wherein the hydrophobic group of the alkoxymonosilane compound is a chain aliphatic hydrocarbon group having 3 or more and 20 or fewer carbon atoms.

6. The method for region-selectively forming a film on a surface of a substrate according to claim 1, wherein the silylation agent (A) is a compound having a hydrophobic group bonded to a silicon atom and a leaving group bonded to a silicon atom.

7. The method for region-selectively forming a film on a surface of a substrate according to claim 1, wherein in the surface after exposure to the surface treatment agent, the contact angles of water of the adjacent regions in the two or more regions differ by 20° or more.

8. The method for region-selectively forming a film on a surface of a substrate according to claim 1, wherein the nitrogen-containing heterocyclic compound (B) is one or more selected from the group consisting of an imidazole that may have a substituent, a triazol that may have a substituent, a tetrazole that may have a substituent, a benzotriazole that may have a substituent, and a pyrazole that may have a substituent, and wherein the substituents are respectively one or more selected from the group consisting of an alkyl group having 1 or more and 6 or less carbon atoms, a cycloalkyl group having 3 or more and 8 or less carbon atoms, an alkoxy group having 1 or more and 6 or less carbon atoms, a cycloalkyloxy group having 3 or more and 8 or less carbon atoms, an aryl group having 6 or more and 20 or less carbon atoms, an aralkyl group having 7 or more and 20 or less carbon atoms, an alkyl halide group having 1 or more and 6 or less carbon atoms, an aliphatic acyl group having 2 or more and 7 or less carbon atoms, an aliphatic acyl halide group having 2 or more and 7 or less carbon atoms, an aryl carbonyl group having 7 or more and 20 or less carbon atoms, a carboxyalkyl group having 2 or more and 7 or less carbon atoms, a halogen atom, a hydroxyl group, a mercapto group, an alkylthio group having 1 or more and 6 or less carbon atoms, an amino group, a monoalkyl amino group including an alkyl group having 1 or more and 6 or less carbon atoms, a dialkyl amino group including an alkyl group having 1 or more and 6 or less carbon atoms, a nitro group, a cyano group.

\* \* \* \* \*